US012613757B2

(12) United States Patent
Ren et al.

(10) Patent No.: US 12,613,757 B2
(45) Date of Patent: Apr. 28, 2026

(54) CORE TEST METHOD AND CORE TEST CIRCUIT

(71) Applicant: MediaTek Singapore Pte. Ltd., Singapore (SG)

(72) Inventors: Jianguo Ren, Beijing (CN); Hung-Yu Chiou, Hsinchu City (TW); Cheng-Tien Wan, Hsinchu City (TW); Chao-Yang Yeh, Hsinchu City (TW); Wei-Lien Chen, Hsinchu City (TW); Man-Yun Su, Hsinchu City (TW); Zemin Xu, Beijing (CN); Wen-Hao Hsueh, Hsinchu City (TW); Wei-Chuan Liu, Hsinchu City (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 234 days.

(21) Appl. No.: 18/142,025

(22) Filed: May 2, 2023

(65) Prior Publication Data

US 2024/0345941 A1    Oct. 17, 2024

(30) Foreign Application Priority Data

Apr. 13, 2023   (CN) .......................... 202310396038.4

(51) Int. Cl.
*G06F 11/00* (2006.01)
*G06F 11/07* (2006.01)
*G06F 11/34* (2006.01)
*G06F 11/3668* (2025.01)
*G01R 31/3177* (2006.01)
*G01R 31/319* (2006.01)

(52) U.S. Cl.
CPC ...... *G06F 11/0724* (2013.01); *G06F 11/3409* (2013.01); *G06F 11/3476* (2013.01); *G06F 11/3688* (2013.01); *G06F 11/3692* (2013.01); *G01R 31/3177* (2013.01); *G01R 31/319* (2013.01)

(58) Field of Classification Search
CPC ............. G06F 11/0724; G06F 11/3409; G06F 11/3476; G06F 11/3688; G06F 11/3692
See application file for complete search history.

(56) References Cited

U.S. PATENT DOCUMENTS

| | | | | |
|---|---|---|---|---|
| 11,630,750 | B1 * | 4/2023 | Chang ................. | G06F 11/3409 |
| | | | | 702/186 |
| 2011/0271141 | A1 * | 11/2011 | Kursun ................. | G06F 11/008 |
| | | | | 714/1 |
| 2012/0144246 | A1 * | 6/2012 | Dreyfoos ............ | G06F 11/3466 |
| | | | | 714/47.1 |
| 2014/0281696 | A1 * | 9/2014 | Bacha ................... | G06F 11/076 |
| | | | | 714/10 |
| 2019/0278677 | A1 * | 9/2019 | Terechko ................ | G06F 11/27 |
| 2020/0217886 | A1 * | 7/2020 | Chen .............. | G01R 31/318572 |
| 2020/0217887 | A1 * | 7/2020 | Chen .............. | G01R 31/318572 |
| 2022/0342739 | A1 * | 10/2022 | Zhang ................. | G06F 11/0724 |
| 2024/0004680 | A1 * | 1/2024 | Jiang ................... | G06F 11/3409 |
| 2024/0132083 | A1 * | 4/2024 | Kalva .................... | G06F 11/36 |
| 2024/0296105 | A1 * | 9/2024 | Gal-On .............. | G06F 11/3089 |

* cited by examiner

*Primary Examiner* — Joshua P Lottich
(74) *Attorney, Agent, or Firm* — Winston Hsu

(57) ABSTRACT

A core test method, for testing a processing circuit with multi cores, comprising: (a) testing defects of the cores to determine at least one failed core; (b) recording the failed core; (c) performing a performance test to all of the cores to generate performance data; and (d) filtering the performance data based on the failed core recorded in the step (b).

13 Claims, 7 Drawing Sheets

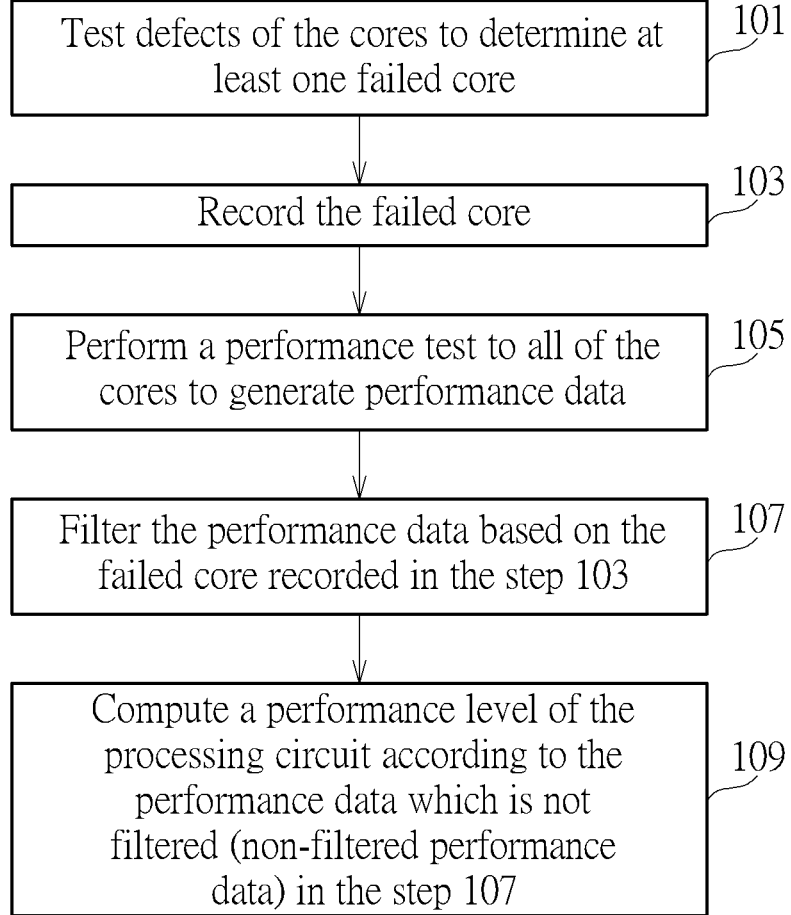

| |
|---|
| Test defects of the cores to determine at least one failed core   101 |
| Record the failed core   103 |
| Perform a performance test to all of the cores to generate performance data   105 |
| Filter the performance data based on the failed core recorded in the step 103   107 |
| Compute a performance level of the processing circuit according to the performance data which is not filtered (non-filtered performance data) in the step 107   109 |

FIG. 1

| Core | 1 | 2 | 3 | 4 | 5 | 6 | 7 | 8 | 9 | 10 | 11 | 12 |
|---|---|---|---|---|---|---|---|---|---|---|---|---|
| First stage defect test | EFUSE | 0 | 0 | 1 | 0 | 0 | 0 | 0 | 0 | 0 | 0 | 0 | 0 |
| Second stage defect test | EFUSE | 0 | 0 | 1 | 0 | 0 | 0 | 0 | 1 | 0 | 0 | 0 | 0 |
| Performance | SO | 0 | 0 | 0 | 0 | 0 | 0 | 0 | 0 | 0 | 0 | 1 | 0 |

FIG. 4

CORE TEST METHOD AND CORE TEST CIRCUIT

BACKGROUND

The cores in a multi-core processor need to be tested to determine if the processor has any failed core. After that, the non-failed cores are tested to compute the performance thereof. However, these steps need to start a procedure for determining the failed cores first, then select non-failed cores from all of the cores, and then perform another procedure to compute the performance of the non-failed cores. Accordingly, the whole test flow is time consuming and power consuming.

SUMMARY

One objective of the present invention is to provide a core test method which needs no extra step for selecting non-failed cores in a performance test.

Another objective of the present invention is to provide a core test circuit which needs no extra step for selecting non-failed cores in a performance test.

One embodiment of the present invention discloses a core test method, for testing a processing circuit with multi cores, comprising: (a) testing defects of the cores to determine at least one failed core; (b) recording the failed core; (c) performing a performance test to all of the cores to generate performance data; and (d) filtering the performance data based on the failed core recorded in the step (b).

Another embodiment of the present invention discloses a core test circuit, comprising: a data receiving circuit, configured to receive a defect result for a defect test to generate defect result codes, or to receive performance data for a performance test to generate performance data codes; a logic circuit, coupled to the data receiving circuit, configured to receive the defect result codes to generate a defect result value; a recording unit, coupled to the logic circuit, configured to record the defect result value; and a multiplexer, coupled to the logic circuit and the data receiving circuit, configured to output a logic output in a first mode, and to output the defect result codes or the performance codes in a second mode; wherein the logic circuit generates the logic output according to the defect result value recorded in the recording unit and the performance data codes.

In view of the embodiment illustrated, the non-failed cores do not need to be particularly selected from all of the cores. The performance data of the failed cores can be automatically filtered while computing the performance level of the processing circuit. Accordingly, time and power consumption for the core test can be reduced.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a flow chart illustrating a core test method according to one embodiment of the present invention.

FIG. 3 and FIG. 4 are schematic diagrams illustrating examples for the operations illustrated in FIG. 1.

DETAILED DESCRIPTION

In the following descriptions, several embodiments are provided to explain the concept of the present application. The term "first", "second", "third" in following descriptions are only for the purpose of distinguishing different one component, and do not mean the sequence of the elements. For example, a first device and a second device only mean these devices can have the same structure but are different devices.

The following test methods or test circuits can be utilized to a logic test or a memory test (e.g., MBIST). FIG. 1 is a flow chart illustrating a core test method according to one embodiment of the present invention. The core test method is for testing a processing circuit (e.g., a processor or a processing unit) with multi cores. The core test method comprises following steps:

Step 101

Test defects of the cores to determine at least one failed core.

For example, if a net of a core has a fixed logic value, the core may be determined as a failed core.

Step 103

Record the failed core.

For example, record the identification information of the failed core.

Step 105

Perform a performance test to all of the cores to generate performance data.

Please note, the step 105 tests the performance of all cores which comprise non-failed cores and failed cores, rather than only the non-failed cores. In one embodiment, the performance data comprises output voltages of the cores.

The performance data may be defined corresponding to different requirements. For example, the performance data may comprise a minimum operation voltage or a maximum operation frequency of the core.

Step 107

Filter the performance data based on the failed core recorded in the step 103.

Step 109

Compute a performance level of the processing circuit according to the performance data which is not filtered (non-filtered performance data) in the step 107.

In other words, step 109 computes a performance level of the processing circuit according to the performance data of the non-failed cores but not according to the performance data of the failed cores.

In one embodiment, the term "filter" in the step 107 means "ignoring". Accordingly, the step 107 ignores the performance data of the failed core even if it exists. In other words, the step 105 comprises testing the performance of the failed core recorded in the step 103 and the step 109 computes the performance level of the processing circuit without considering the performance data of the failed core. In one embodiment, the step 109 can be removed, such that the non-filtered performance data in step 107 can be processed by other steps.

Figure 2:
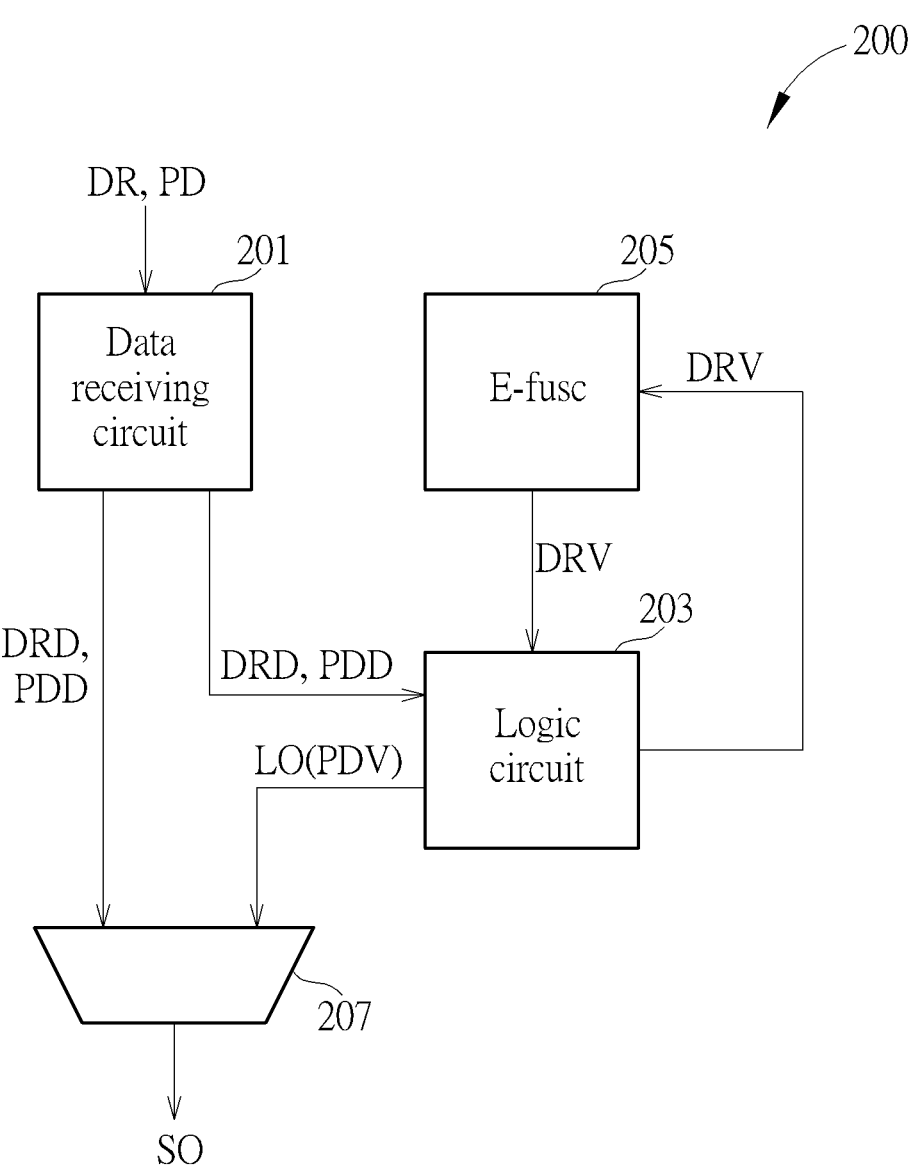
FIG. 2 is a block diagram illustrating a core test circuit according to one embodiment of the present invention.

The steps illustrated in FIG. 1 can be performed by executing a program recorded in a recording media such as a hard disk or a memory. In one embodiment, the steps illustrated in FIG. 1 is implemented by a core test circuit. FIG. 2 is a block diagram illustrating a core test circuit 200 according to one embodiment of the present invention. Please note, FIG. 2 is only an example for explaining. Any circuit which can perform the same function should also fall into the scope of the present invention.

As shown in FIG. 2, the core test circuit 200 comprises a data receiving circuit 201, a logic circuit 203, an E-fuse 205 and a multiplexer 207. Please note, the E-fuse can be replaced by any other recording unit. The data receiving circuit 201 is configured to receive a defect result DR (the test result of the step 101) or performance data PD (the performance data PD in the step 105), and is configured to selectively output defect result codes DRD or performance codes PDD. In one embodiment, the data receiving circuit 201 comprises a compressor or a comparing circuit to implement functions thereof. The compressor and the comparing circuit may be provided in a multiplexer, and may be multiple input shift registers. The defect result DR or the performance data PD can be acquired by, for example, providing test patterns to the cores of the processing circuit.

In a first mode, the data receiving circuit 201 outputs defect result codes DRD or performance codes PDD to the logic circuit 203. Then, the logic circuit 203 generates a defect result value DRV according to the defect result codes DRD, or generates a performance data value PDV according to the performance codes PDD. The performance data value PDV is output by the logic circuit 203 as the logic output LO. Also, in the first mode, the logic output LO is output by the multiplexer 207 as the scan out SO. The defect result value DRV is a logic value corresponding to the defect result DR and the performance data value PDV is a logic value corresponding to the performance data PD. In a second mode, the data receiving circuit 201 outputs the defect result codes DRD or the performance codes PDD to the multiplexer 207. Then, the multiplexer 207 outputs the defect result codes DRD or the performance codes PDD as the scan out SO.

In the first mode, if the core is a failed core, the defect result value DRV is a first logic value and is recorded to a corresponding address of the E-fuse 205. Next, while performing the performance test, the defect result value DRV recorded in the E-fuse 205 is received by the logic circuit 203, and the logic circuit 203 correspondingly generates the logic output LO (the performance data value PDV). On the opposite, if the core is a non-failed core, the defect result value DRV is a second logic value and is still recorded to the E-fuse 205. Accordingly, in the first mode, the scan out SO is affected by the defect result value DRV stored in the E-fuse 205, no matter the core is a failed core or a non-failed core. If the E-fuse 205 does not record any defect result value DRV in an address for a core while the logic circuit generating the defect result value DRV for the core, the E-fuse 205 may have an initial value in the address such that the logic circuit 203 may generate a correct defect result value DRV to the E-fuse 205.

Figure 3:
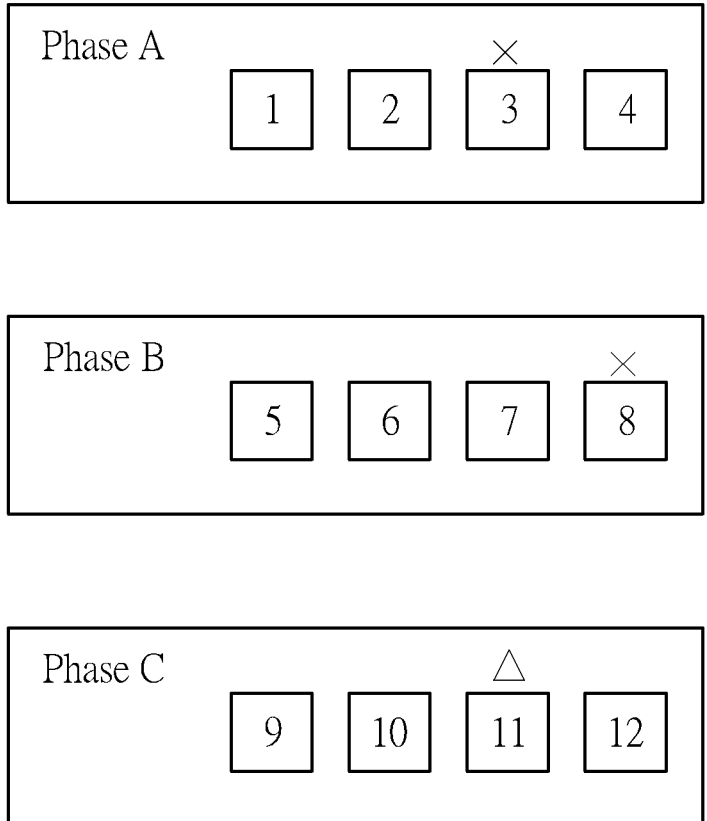

FIG. 3 and FIG. 4 are schematic diagrams illustrating examples for the operations of the core test circuit 200 illustrated in FIG. 2. As shown in FIG. 3, the processing circuit comprises 12 cores corresponding to numbers 1-12. The phase A, phase B and phase C mean different times of testing cores. For example, cores 1, 2, 3, and 4 are simultaneously tested and cores 5, 6, 7, and 8 are simultaneously tested. The core 3, core 8 are failed cores and others are non-failed cores. Also, as shown in FIG. 4, the core 3 does not pass the first stage detect test and the second stage defect test, thus the defect result value DRV, which is 1 in this example (the first logic value), is recorded to an address corresponding to the core 3 in the E-fuse 205. Similarly, the core 8 does not pass the second stage defect test, thus the defect result value DRV, which is 1, is recorded to an address corresponding to the core 8 in the E-fuse 205. On the contrary, if the core is a non-failed core, such as the core 2 or core 4, the defect result values DRV, which are 0 (the second logic value), are recorded to addresses corresponding to core 2 and core 4 in the E-fuse 205.

Next, the cores 1 and 2 pass the performance test. In such case, the performance data value PDV is a specific logic value (0 in this example). The logic circuit 203 reads the corresponding defect result value DRV (0 in such case) from the E-fuse 205, and generates the logic output LO responding to the defect result value DRV from the E-fuse 205. Then, the multiplexer 207 outputs the logic output LO as the scan out SO.

In the performance test of core 3, the logic circuit 203 receives the corresponding defect result value DRV (1 in this example) from the E-fuse 205, and generates the logic output LO responding to the defect result value DRV from the E-fuse 205. Then, the multiplexer 207 outputs the logic output LO as the scan out SO. In such case, the scan out SO corresponding to the core 3 is also 0.

In above-mentioned descriptions, although the scan outs of the cores 1, 2, 3 are all 0, the performance of the cores 1, 2 are used to compute the performance level of the processing circuit, but the performance of the core 3 is not considered, since the E-fuse 205 records that the core 3 is a failed core. In other words, the performance data of the core 3 is filtered or ignored, as above-mentioned, since it is a failed core. In other words, the performance data of the core 3 is filtered or ignored, based on the corresponding defect result value DRV which is 1 in the E-fuse 205. The computation of the power level can be performed, for example, by a test machine coupled to the core test circuit 200.

Cores 4, 5, 6, 7, 9, 10 and 12 follow the same rules of the core 1, 2. Further, core 8 follows the same rule of core 3. Thus descriptions thereof are omitted for brevity here. Additionally, core 11 is a non-failed core in the examples of FIG. 3 and FIG. 4, but fails to pass the performance test. Thus, the logic output LO corresponding to core 11 is 1 rather than 0 during the performance test. In such case, the performance of the core 11 is still considered while computing the performance level of the processing circuit, thus the performance level of the processing circuit is decreased due to the performance of the core 11. In one embodiment, the core which fails to pass the performance test is not particularly recorded. In such case, the logic output LO corresponding to core 11 is 0 rather than 1 shown in the embodiment of FIG. 4.

In view of the embodiment illustrated in FIG. 1 and FIG. 2, the non-failed cores do not need to be particularly selected from all of the cores. The performance test can be performed to all of the cores comprising failed cores and non-failed cores. Next, the performance data of the failed cores can be automatically filtered while computing the performance level of the processing circuit. No extra selection step and test step are needed.

Figure 5:
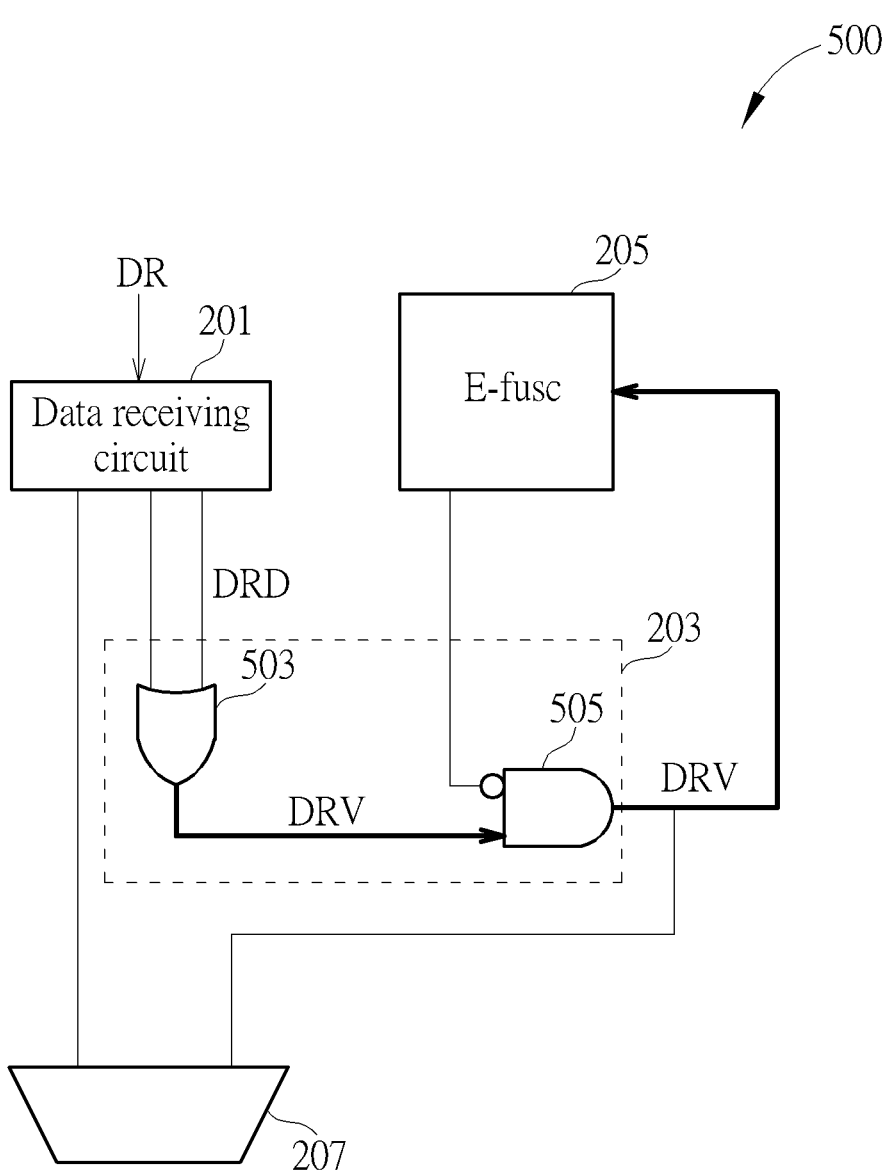
FIG. 5 and FIG. 6 are circuit diagrams illustrating a detail structure of the core test circuit illustrated in FIG. 4, according to one embodiment of the present invention.
Figure 6:
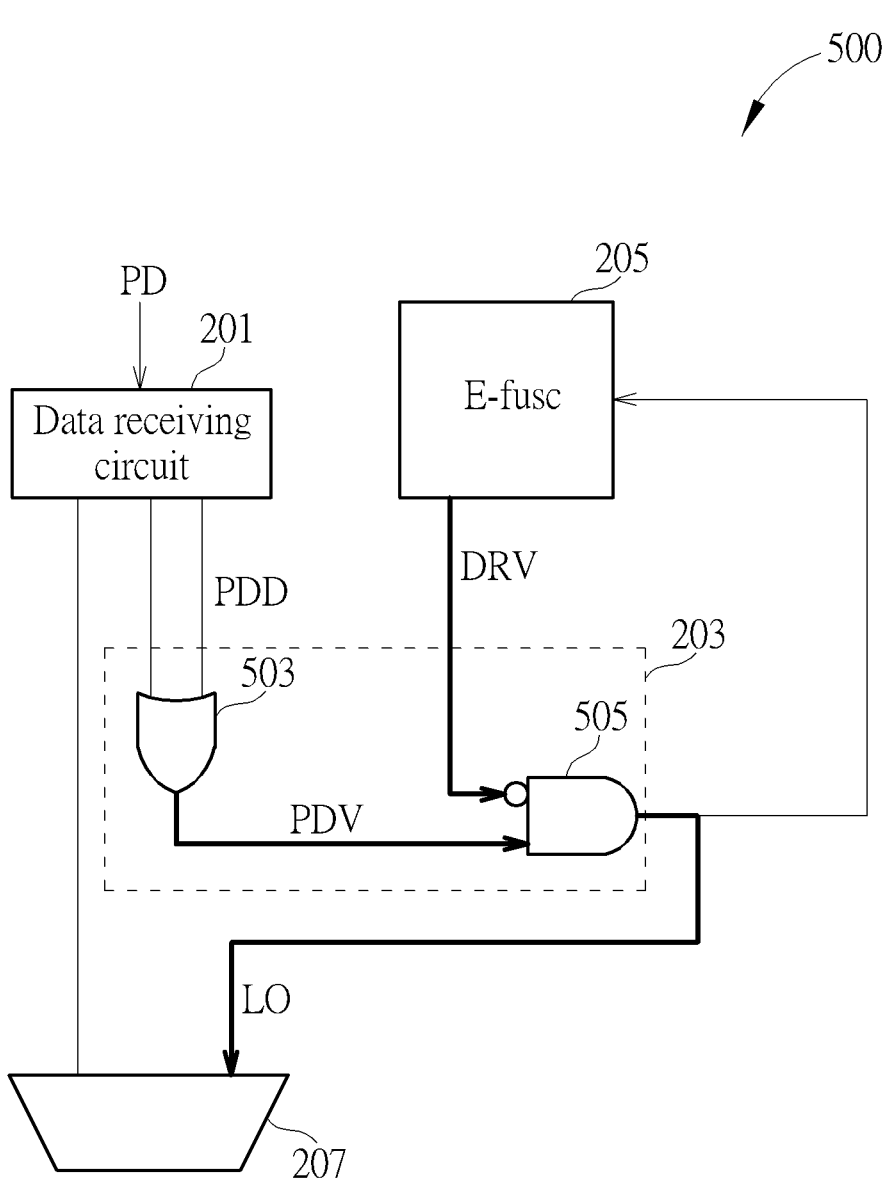

The core test circuit 200 in FIG. 2 can be implemented by various circuits. FIG. 5 and FIG. 6 are circuit diagrams illustrating a detail structure of the core test circuit illustrated in FIG. 2, according to one embodiment of the present invention. As shown in FIG. 5, the logic circuit 203 comprises an OR gate 503 and an NIMPLY gate 505. Also, the defect result DR, the performance data PD, the defect result codes DRD and the performance data codes PDD may have different contents corresponding to different core test procedures.

As above-mentioned, the data receiving circuit 201 can operate in the first mode or the second mode to selectively output the defect result codes DRD or the performance data codes PDD. Thus in the embodiment of FIG. 5 and FIG. 6, the data receiving circuit 201 receives the defect result DR or the performance data PD to correspondingly generates detect result codes DRD or the performance data codes PDD. The OR gate 503 generates the detect result value DRV or the performance data value PDV corresponding to the detect result codes DRD or the performance data codes PDD. Further, the NIMPLY gate 505 comprises a first terminal coupled to the E-fuse 205 and a second terminal coupled to the OR gate 503. Besides, an output terminal of the NIMPLY gate 505 is coupled to the E-fuse 205. In one embodiment, a register can be provided between the E-fuse 205 and the NIMPLY gate 505. Please note, in one embodiment, the OR gate 503 can be a plurality of OR gates which respectively receive one code of the defect result codes DRD or the performance codes PDD, rather than only one XOR gate.

As mentioned in FIG. 2, the defect result value DRV is recorded to an address corresponding to the core being tested in the E-fuse 205 in the first mode. Such operation is illustrated in FIG. 5. Accordingly, as shown by bold lines in FIG. 5, the data receiving circuit 201 receives the defect result DR to generate the defect result codes DRD, and the OR gate 503 generates the defect result value DRV according to the defect result codes DRD. Specifically, the OR gate 503 generates one defect result value DRV according to each two of the defect result codes DRD. Next, the defect result value DRV is recorded to the E-fuse 205 via the NIMPLY gate 505.

Further, as illustrated in FIG. 2, while w performing the performance test, the defect result value DRV recorded in the E-fuse 205 is received by the logic circuit 203, and the logic circuit 203 correspondingly generates a logic output LO, which is served as a scan out SO of the multiplexer 207. Accordingly, as shown by bold lines in FIG. 6, while performing the performance test, the data receiving circuit 201 receives the performance data PD to generate the performance data codes PDD, then the OR gate 503 generates the performance data value PDV. The NIMPLY gate 505 also receives the performance data value PDV and the defect result value DRV recorded in the E-fuse 205, to generate the logic output LO.

Figure 7:
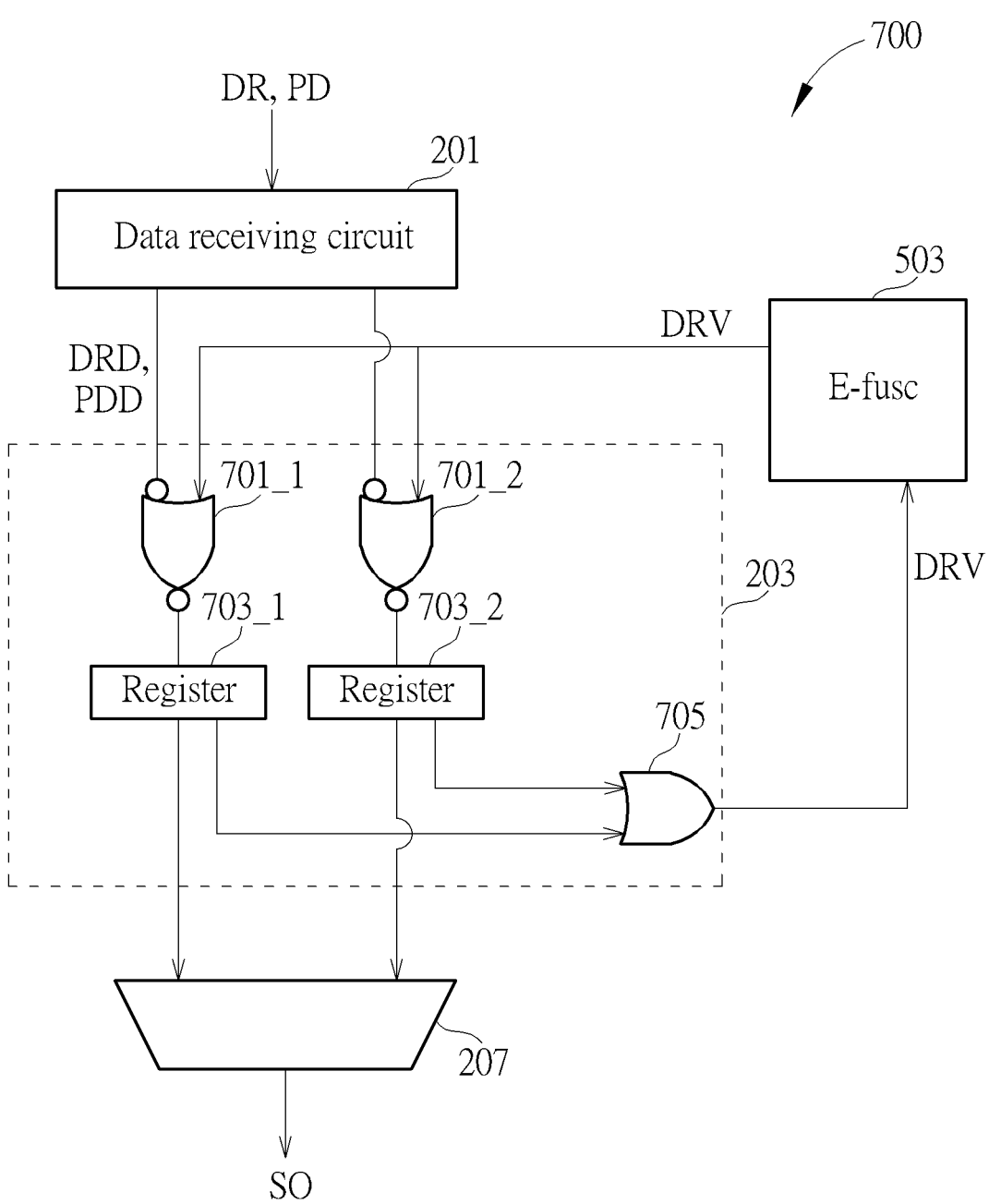
FIG. 7 is a circuit diagram illustrating a core test circuit according to another embodiment of the present invention.

The logic circuit 503 in FIG. 5 and FIG. 6 can be implemented by other circuitries. FIG. 7 is a circuit diagram illustrating a core test circuit 700 according to another embodiment of the present invention. As shown in FIG. 7, the logic circuit 203 comprises a first inverted IMPLY gate 701_1, a second inverted IMPLY gate 701_2, a first register 703_1, a second register 703_1 and an OR gate 705. It will be appreciated that numbers of the inverted IMPLY gates and the registers can be more than two in other embodiments.

The first inverted IMPLY gate 701_1 and the second inverted IMPLY gate 701_3 are IMPLY gates but the output thereof are inverted. Each of the first inverted IMPLY gate 701_1 and the second inverted IMPLY gate 701_3 comprises a first input terminal receiving the defect result value DRV recorded in the E-fuse 503, and comprises a second input terminal receiving an inverted value of a code of the defect result codes DRD or a code of the performance codes PDD. The first register 703_1 and the second register 703_2 are configured to register outputs of the first inverted IMPLY gate 701_1 and the second inverted IMPLY gate 701_3, and then output to the OR gate 705. The values of the first register 703_1 and the second register 703_2 are also output as the scan out SO.

The operations of the core test circuit 700 are similar with the operations of the core test circuit 500 in FIG. 5 and FIG. 6. During the defect test, the first inverted IMPLY gate 701_1 and the second inverted IMPLY gate 701_2 respectively receive a code of the defect result code DRD. Also, the first register 703_1 and the second register 703_2 respectively receive the output of the first inverted IMPLY gate 701_1 and the second inverted IMPLY gate 701_2. Then, the OR gate 705 receives the values of the first register 703_1 and the second register 703_2, to generate the defect result value DRV, which is recorded in the E-fuse 205.

Moreover, during the performance test, the first inverted IMPLY gate 701_1 and the second inverted IMPLY gate 701_2 respectively receive a code of the performance data codes PDD and receive the defect result value DRV recorded in the E-fuse 205. Also, the first register 703_1 and the second register 703_2 respectively receive the output of the first inverted IMPLY gate 701_1 and the second inverted IMPLY gate 701_2, which is affected by the defect result value DRV. The values of the first register 703_1 and the second register 703_2 are output by the multiplexer 207 as the scan out SO. That is, the values of the first register 703_1 and the second register 703_2 are the above-mentioned logic out LO during the performance test. By this way, the performance data of the failed core can also be filtered according to the defect result value DRV.

In view of the embodiment illustrated, the non-failed cores do not need to be particularly selected from all of the cores. The performance data of the failed cores can be automatically filtered while computing the performance level of the processing circuit. Accordingly, time and power consumption for the core test can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A core test method, for testing a processing circuit with multiple cores, comprising:
   (a) testing each of the multiple cores to determine defects, generating a first logic value when a core is determined as failed, and generating a second logic value when a core is determined as non-failed;
   (b) recording the generated logic value for each core;
   (c) performing a first performance test according to an operation frequency and performing a second performance test according to an operation voltage on all of the cores to generate performance data corresponding to each core;
   (d) generating a scan output according to the generated performance data and the generated logic value for each core; and
   (e) accessing the generated logic value for each core for filtering the performance data of each corresponding core.

2. The core test method of claim 1, wherein the step (e) further comprises ignoring the performance data of each failed core.

3. The core test method of claim 1, wherein the step (b) records the generated logic value in an E-fuse.

4. The core test method of claim 3, wherein the step (d) comprises:

outputting the generated logic value corresponding to the defect result of each core recorded in the E-fuse to a logic circuit;

and the step (e) comprises:

filtering the performance data based on the generated logic value recorded in the E-fuse.

5. A core test circuit for a processing circuit with multiple cores, comprising:

a data receiving circuit, configured to receive a defect result for a defect test of each of the multiple cores to generate defect result codes for each core, or to receive performance data of a first performance test according to an operation frequency and a second performance test according to an operation voltage of the multiple cores to generate performance data codes for each core;

a logic circuit, coupled to the data receiving circuit, configured to receive the performance data codes for each core, or configured to receive the defect result codes for each core to generate a defect result value, wherein the defect result value is a first logic value when a core is determined as failed, and the defect result value is a second logic value when a core is determined as non-failed;

a recording unit, coupled to the logic circuit, configured to record the defect result value; and a multiplexer, coupled to the logic circuit and the data receiving circuit, configured to output a logic output in a first mode, and to output the defect result codes or the performance codes in a second mode;

wherein in the first mode, the logic circuit generates the logic output according to the defect result value recorded in the recording unit and the performance data codes for each core, and the logic output is output by the multiplexer as a scan output, and the performance data of each core is filtered by accessing the corresponding defect result value recorded in the recording unit.

6. The core test circuit of claim 5, wherein the data receiving circuit comprises a compressor or a comparator configured to receive the defect result to generate the defect result codes, or to receive the performance data to generate the performance data codes.

7. The core test circuit of claim 6, wherein the data receiving circuit is a multiple input shift register.

8. The core test circuit of claim 5, wherein the logic circuit comprises:

an OR gate, comprising input terminals coupled to the data receiving circuit; and a NIMPLY gate, comprising a first terminal coupled to the recording unit, comprising a second terminal coupled to an output of the OR gate, and comprising an output terminal coupled to the recording unit.

9. The core test circuit of claim 8, wherein the OR gate receives the defect result codes to generate the defect result value in the defect test;

wherein the NIMPLY gate outputs the defect result value to the recording unit in the defect test.

10. The core test circuit of claim 8, wherein the OR gate receives the performance data codes to generate the performance data value in the performance test;

wherein the NIMPLY gate generates the logic output.

11. The core test circuit of claim 5, wherein the logic circuit comprises:

a first inverted IMPLY gate, comprising one input terminal coupled to the data receiving circuit and one input terminal coupled to the recording unit;

a second inverted IMPLY gate, comprising one input terminal coupled to the data receiving circuit and one input terminal coupled to the recording unit a first register, coupled to an output terminal of the first inverted IMPLY gate and coupled to the multiplexer;

a second register, coupled to an output terminal of the second inverted IMPLY gate and coupled to the multiplexer; and an OR gate, coupled to the output terminals of the first register and the second register.

12. The core test circuit of claim 11, wherein the first inverted IMPLY gate and the second inverted IMPLY gate respectively receive a code of the defect result codes in the defect test;

wherein the OR gate receives outputs of the first register and the second register to generate the defect result value in the defect test.

13. The core test circuit of claim 11, wherein the first inverted IMPLY gate and the second inverted IMPLY gate respectively receive a code of the performance data codes and receives the data result value recorded in the recording unit in the performance test;

wherein the multiplexer outputs values of the first register and the second register as the scan out in the performance test.

\* \* \* \* \*